United States Patent [19]

Kunugi et al.

[11] Patent Number: 4,688,258
[45] Date of Patent: Aug. 18, 1987

[54] AUTOMATIC GRAPHIC EQUALIZER

[75] Inventors: Yoshiro Kunugi; Shinichi Suzuki; Masayuki Kato, all of Saitama, Japan

[73] Assignee: Pioneer Electronic Corporation, Tokyo, Japan

[21] Appl. No.: 793,384

[22] Filed: Oct. 31, 1985

[30] Foreign Application Priority Data

Oct. 31, 1984 [JP] Japan .................. 59-229990

[51] Int. Cl.[4] .......................... H04R 3/04
[52] U.S. Cl. .................. 381/103; 381/102; 381/107
[58] Field of Search ............ 381/103, 107, 59, 115, 381/111; 324/77 E, 78 R

[56] References Cited

U.S. PATENT DOCUMENTS

| | | | |
|---|---|---|---|
| 3,207,848 | 9/1965 | Bore | 381/107 |
| 3,708,746 | 1/1973 | Willett | 324/78 F |
| 3,732,370 | 5/1973 | Sacks | 381/59 |
| 4,045,731 | 8/1977 | Tokunou | 324/78 F |
| 4,340,780 | 7/1982 | Odlen | 381/103 |
| 4,458,362 | 7/1984 | Berkovitz | 381/103 |
| 4,610,024 | 9/1986 | Schulhof | 381/103 |

FOREIGN PATENT DOCUMENTS

| | | | |
|---|---|---|---|
| 58-138200 | 8/1983 | Japan | 381/103 |
| 59-230315 | 12/1984 | Japan | 381/103 |
| 2068678 | 8/1981 | United Kingdom | 381/103 |

OTHER PUBLICATIONS

"Simple Spectrum Analyser Covers Four Octaves," *Electronic Product Design*, vol. 1, No. 3, Jun. 1980, p. 31.

*Primary Examiner*—Gene Z. Rubinson
*Attorney, Agent, or Firm*—Sughrue, Mion, Zinn, Macpeak, and Seas

[57] ABSTRACT

An automatic graphic equalizer for a sound system has circuitry for measuring the effect of the physical environment receiving a sound on the frequency characteristics of the sound, and for adjusting the characteristics of a graphic equalizer to compensate for distortions in the desired flat frequency response caused by the physical environment. The circuitry includes a pink noise generator supplying pink noise to the graphic equalizer during an initialization operation, the graphic equalizer being controlled by a controller to present a flat frequency characteristic. The equalizer output is sent to a speaker which supplies the pink noise as a sound signal to the selected environment. A microphone picks up the sound in the selected environment and converts it to an electrical signal which is supplied through an ALC amplifier to a frequency-variable band-pass filter to detect the signal level in each of the equalizer frequency bands. The level signals are smoothed in a level detector and digitized to be input to the controller which readjusts the graphic equalizer to compensate for distortions in the desired flat frequency response caused by the selected environment.

5 Claims, 4 Drawing Figures

AUTOMATIC GRAPHIC EQUALIZER

BACKGROUND OF THE INVENTION

1. Field of the Invention

The present invention relates to an automatic graphic equalizer and particularly to an automatic graphic equalizer in which the frequency characteristics of sound, produced by a pink noise source, and introduced into and returned from a predetermined physical environment, are measured and the measurement used to automatically control the frequency characteristics of the graphic equalizer.

2. Description of the Prior Art

A conventional automatic graphic equalizer is shown in FIG. 1. In FIG. 1, an adder 2 is provided at an audio signal input terminal 1 so as to add pink noise received from a pink noise generator 3 to an audio signal received through the terminal 1. The output of the adder 2 is applied to a graphic equalizer 4 in which the frequency characteristics of the adder output are controlled. The output from the graphic equalizer 4 is applied to a speaker 6 through an amplifier 5. The speaker converts the electrical input to the speaker into sound which is emitted into a predetermined physical area, for example, the inside of a car.

The emitted sound is reflected from the car interior and received together with the reflected sound by a microphone 7. The microphone is connected to a BPF (band-pass filter) circuit 10 for detecting the frequency characteristics of microphone received sound, through a microphone amplifier 8 and a variable resistor 9. The BPF circuit 10 is constructed of a plurality of BPFs each having a different pass band, the number of BPFs corresponding to the number of adjusting frequency bands of the graphic equalizer 4. The outputs of the respective BPFs are alternatively selected through a switch 11. Each selected output is converted into a digital signal by an A/D (analog-to-digital) converter 12 and applied as an input to controller 13 which may be a programmed microcomputer.

A predetermined program operates the controller 13 to produce controller outputs which control the graphic equalizer 4, the variable resistor 9, and the switch 11 so as to automatically obtain a flat environment frequency characteristic in the selected physical environment.

Such an arrangement operates in the following manner. To initialize the equalizer circuit, the audio signal input terminal 1 is earthed, the pink noise generator 3 is energized to supply pink noise to the graphic equalizer 4, and the graphic equalizer 4 is operated to produce a flat frequency characteristic. The equalized pink noise produced from the equalizer 4 is amplified by the amplifier 5 and emitted into the physical environment, such as a car interior, through the speaker 6. The emitted sound is detected by the microphone 7 together with the sound reflected inside the car, amplified by the microphone amplifier 8, and then applied to the variable resistor 9. The variable resistor 9, controlled by controller 13, is used for making the average level of signals applied to the A/D converter 12 a predetermined reference level.

The controller 13 receives the output of the A/D converter 12 which represents the frequency characteristics of the sound from the selected physical environment and detects these frequency characteristics from the amplitude level of the pink noise which passes through the respective BPFs. The controller 13 then controls the graphic equalizer 4 so as to have frequency characteristics which compensate for the detected frequency characteristics which produce a non-flat frequency spectrum. Accordingly, the sound inside the car appears to have a flat frequency characteristic.

In such a conventional device, however, to detect the respective pink noise levels in the various frequency bands, a plurality of BPFs are necessary in order for the level of pink noise in each of the graphic equalizer's several frequency bands to be detected. Therefore, as the number of the frequency bands is increased, it becomes necessary to correspondingly increase the number of the BPFs and the number of contacts in the switch 11. This makes for a complicated arrangement. Further, because the average pink noise level applied to a group of BPFs changes depending on the apparatus mounting position and/or the conditions inside the car, it is necessary to make the average level of the pink noise some predetermined value before measuring the frequency characteristics. Therefore, the variable resistor 9 is required which further complicates the device.

SUMMARY OF THE INVENTION

It is an object of the present invention to eliminate the above-mentioned disadvantages in the conventional automatic graphic equalizer.

It is another object of the present invention to provide an automatic graphic equalizer having a simplified arrangement.

The present invention is applied to an automatic graphic equalizer arranged such that a pink noise signal is applied to an audio signal line. The pink noise is passed through a graphic equalizer and then applied to a speaker which introduces the pink noise as sound into a predetermined physical environment. The sound in the physical environment is detected by a microphone. The level of the detected sound in every one of a plurality of frequency bands is determined, and the frequency characteristics of the graphic equalizer are controlled in response to the respective detected levels. The automatic graphic equalizer of the invention includes a frequency-variable BPF in which the center frequency of the passband can be changed by controlling circuit parameters. This frequency-variable BPF is used as the means for detecting the signal levels in the respective frequency bands of the sound detected by the microphone.

The frequency-variable BPF may be a so-called SCF (switched capacitor filter). The signal detected by the microphone is supplied to the SCF through a microphone amplifier having an ALC (automatic level control) function.

DETAILED DESCRIPTION OF PREFERRED EMBODIMENT

A preferred embodiment of the present invention will now be described with reference to FIGS. 2-4.

Figure 1:
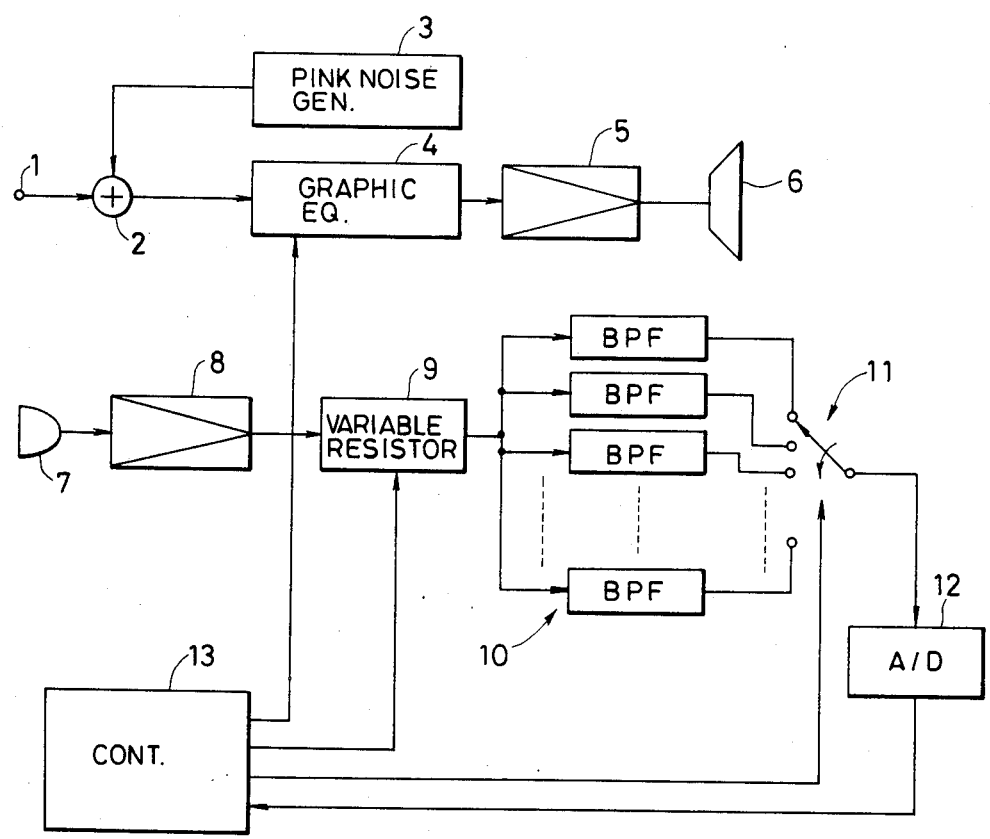
FIG. 1 is a block diagram showing a conventional automatic graphic equalizer.
Figure 2:
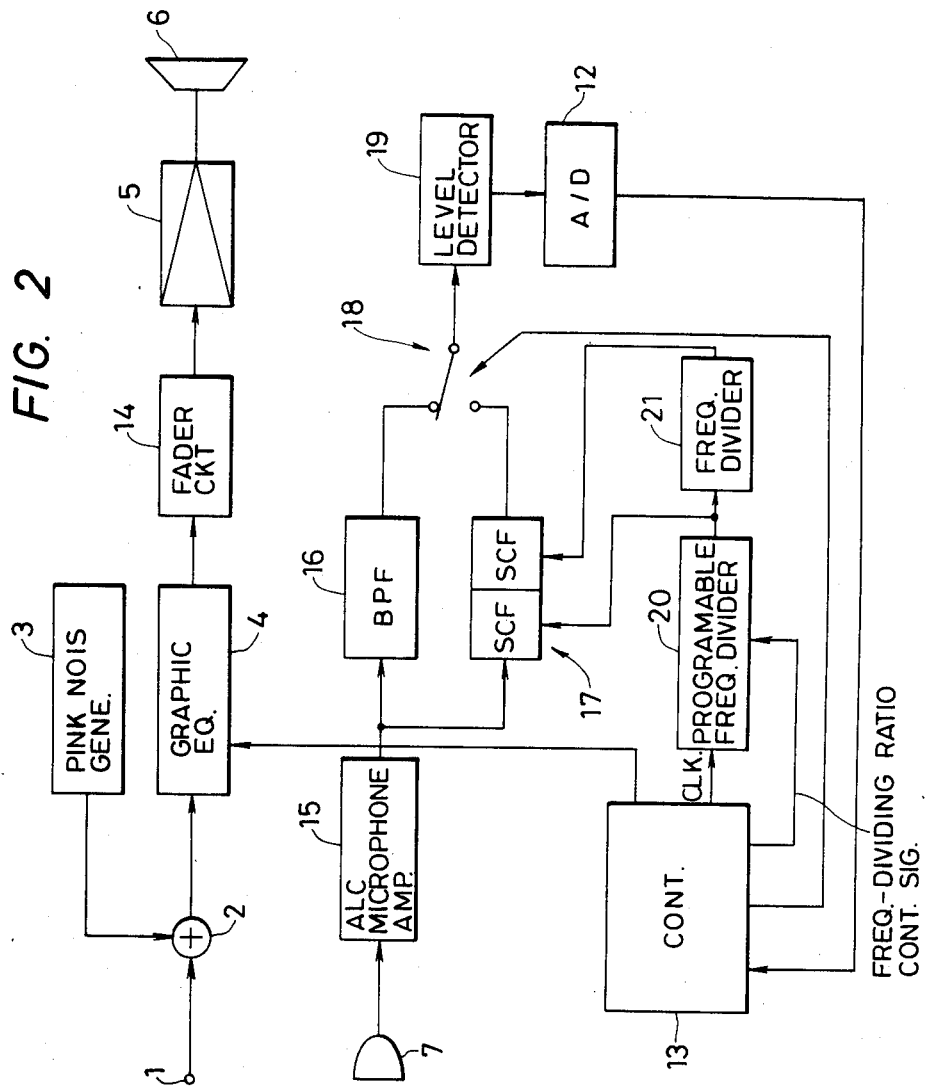
FIG. 2 is a block diagram showing an embodiment of the automatic graphic equalizer according to the present invention.

FIG. 2 is a block diagram showing an embodiment of automatic equalizer according to the present invention. The portions of FIG. 2 which are the same as those in FIG. 1 are identified with common reference numerals. Only the parts different from those shown in FIG. 1 will be described hereinafter. Sound inside a car is detected by microphone 7, and set to a predetermined level by an ALC microphone amplifier 15. The output from amplifier 15 is supplied to a combination circuit comprised of a BPF 16 and an SCF 17. The SCF 17 is comprised, for example, of an LPF (low-pass filter) and an HPF (high-pass filter), the frequency characteristics of the respective filters being controlled, respectively, by the output of a programmable frequency divider 20 and the output of a frequency divider 21, the frequency divider 21 frequency dividing the output of the programmable frequency divider 20.

The BPF 16 is a filter which has a fixed frequency characteristic for allowing signals within a frequency pass-band which cannot be covered by the SCF 17 to pass through. Of course, the BPF 16 is unnecessary if the frequency pass-band can be covered by the SCF 17.

The respective outputs of the filters 16 and 17 are selected by a switch 18 and applied to a level detector 19. The signal levels detected by the detector 19 are supplied to an A/D converter 12.

The balance of the arrangement is the same as that in FIG. 1 except that the output of the graphic equalizer 4 is applied to the amplifier 5 through a fader circuit 14.

The automatic graphic equalizer is initialized as follows. The audio signal input terminal 1 is earthed and the pink noise generator 3 is energized to apply the pink noise to the graphic equalizer 4. The graphic equalizer is controlled to have a flat frequency characteristic. The setting of the initial conditions is automatically performed by a controller 13. Thereafter, the pink noise is emitted into the inside of a defined physical environment such as a car through a speaker 6, and the emitted sound and the reflected sound are detected by the microphone 7. Although the signal detected by the microphine is controlled by the ALC microphone amplifer 15 so that the average output level of the signal becomes a predetermined value, the frequency characteristics of the output signal, which are affected by the conditions inside the car, will nevertheless be detected by the SCF 17.

For the SCF 17 to detect the frequency characteristics over the signal's entire frequency band, the frequency-dividing ratio of the programmable frequency divider 20 is controlled by a frequency-dividing ratio control signal supplied to the programmable frequency divider 20 from the controller 13, so that the pass-band characteristics of the SCF 7 (i.e. the center frequency of the passband) is varied. Therefore, the center frequency of the SCF 17 is sequentially made to coincide with to each of the frequency bands of the graphic equalizer 4. The signal levels in each frequency band to which the SCF is set is detected and applied to the controller 13 in the form of a digital signal by the operation of the A/D converter 12. A level detector 19 is provided to detect the average signal level from the SCF and to rectify and smooth the detected signal, so as to reduce the required sampling frequency of the A/D converter 12. Although the detected signal level may be applied directly to the A/D converter 12 without smoothing, the sampling frequency is necessarily increased requiring a more complicated circuit.

The data indicating the detected signal level in each frequency band so obtained is analyzed by the controller 13, and then the graphic equalizer 4 is adjusted on the basis of this analysis so that a flat frequency characteristic can be obtained over all frequency bands.

Figure 3:
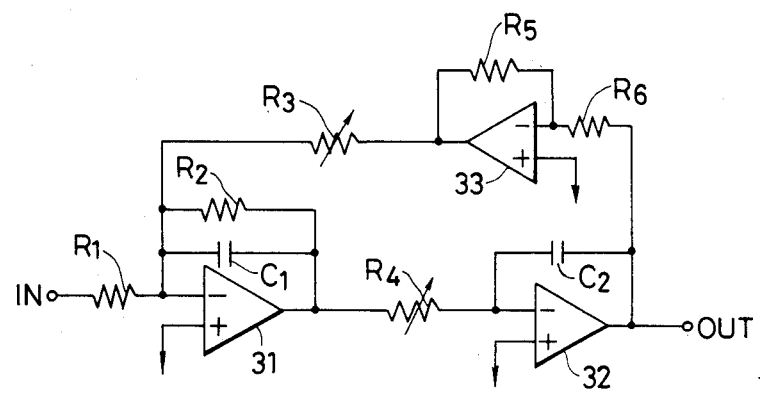
FIGS. 3 and 4 are circuit diagrams of portions of the switched capacitor filter shown in block form of in FIG. 2.
Figure 4:
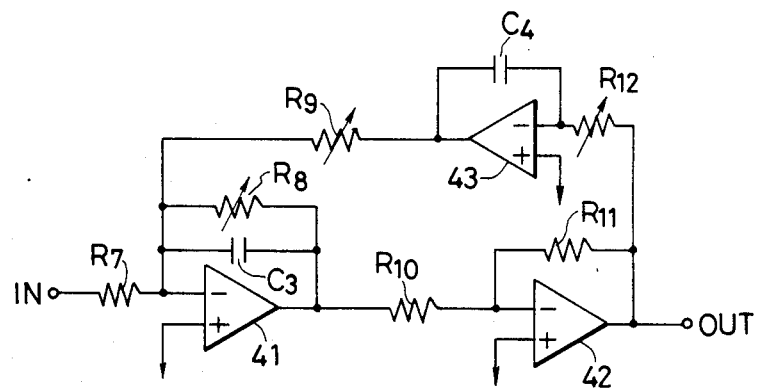

FIGS. 3 and 4 are circuit diagrams each showing a portion of the circuit of SCF 17, which is a so-called f-variable (frequency-variable) type filter. FIGS. 3 and 4 are circuit diagrams of an LPF and an HPF, respectively, in which only the frequency f can be changed with the Q (sharpness) kept substantially constant by suitably changing variable resistor elements $R_2$-$R_3$ (FIG. 3) and variable resistor elements $R_8$, $R_9$, and $R_{12}$ (FIG. 4).

FIG. 3 shows an example of the LPF comprised of operational amplifiers 31-33, capacitors $C_1$ and $C_2$, and resistors $R_1$-$R_6$. In the LPF, the cut-off frequency $f_c$ is $1/(C_1C_2R_3R_4)$ and Q is $R_2/R_3$. In this case, $R_5$ is selected to be equal to $R_6$. FIG. 4 shows an example of the HPF comprised of operational amplifiers 41-43, capacitors $C_3$ and $C_4$, and resistors $R_7$-$R_{12}$. In this HPF, the cut-off frequency $f_c$ is $1/(C_3C_4R_9R_{12})$ and Q is $R_8/R_{12}$. In this case, $R_{10}$ is made equal to $R_{11}$.

Accordingly, if the LPF and HPF are connected in series and the respective values of $f_c$ are suitably set, it is possible to provide a BPF, the center frequency of which is controllable. If the variable resistors $R_2$-$R_4$ and the variable resistors $R_8$, $R_9$, and $R_{12}$ in the LPF and HPF respectively, are comprised of the so-called switched capacitors (SC), the SCF can be realized.

According to the present invention, for example, an SCF in which the center-frequency of the passband can be easily controlled by changing circuit parameters is used for detecting respective frequencies. In this way multiple band pass filters and a complex switching circuit can be eliminated from the automatic graphic equalizer.

If a device having the ALC function is used as a microphone amplifier, the arrangement can be further simplified because it becomes unnecessary to use a complicated variable resistor arrangement responsive to the controller 13 output.

What is claimed is:

1. An automatic graphic equalizer comprising:
   pink noise generating means;
   means for producing pink noise from said pink noise generating means on an audio signal line;
   graphic equalizer means connected to said audio signal line for adjusting the frequency characteristics of received signals;
   means for converting the output from said graphic equalizer means into a sound signal and for introducing said sound signal into a selected physical environment;
   sound detecting means for detecting sound in said selected physical environment; and
   control means for detecting the respective levels of the signals detected by said sound detecting means in a plurality of frequency bands and for controlling the frequency characteristics of said graphic equalizer on the basis of the respective detected levels;
   said control means including a frequency-variable band-pass filter for detecting the respective signal levels in said plurality of frequency bands, the center frequency of the pass-band of said band-pass filter being changeable by controlling filter circuit parameters; wherein said sound detecting means comprises a microphone and an automatic level control amplifier for amplifying the output of said microphone.

2. An automatic graphic equalizer according to claim 1, in which said frequency-variable band-pass filter is a switched capacitor filter.

3. An automatic graphic equalizer according to claim 2, in which said switched capacitor filter is comprised of a high-pass filter and a low-pass filter, said center frequency of the pass-band being changeable in response to a varying frequency clock signal.

4. An automatic graphic equalizer comprising:
pink noise generating means;
means for producing pink noise from said pink noise generating means on an audio signal line;
graphic equalizer means connected to said audio signal line for adjusting the frequency characteristics of received signals;
means for converting the output from said graphic equalizer means into a sound signal and for introducing said sound signal into a selected physical environment;
sound detecting means for detecting sound in said selected physical environment; and
control means for detecting the respective levels of the signals detected by said sound detecting means in a plurality of frequency bands and for controlling the frequency characteristics of said graphic equalizer on the basis of the respective detected levels;
said control means including a frequency-variable band-pass filter for detecting the respective signal levels in said plurality of frequency bands, the center frequency of the pass-band of said band-pass filter being changeable by controlling filter ciruit parameters;
wherein said frequency-variable band-pass filter is comprised of a series connected low-pass filter and high-pass filter;
said low-pass filter comprising a first operational amplifier (31) having a variable feedback resistor in parallel with a feedback capacitor, the output of said first operational amplifier being connected to one input of a second operational amplifier (32) having a feedback capacitor through a first variable resistance ($R_4$), the output of said second operational amplifier being connected to one input of a third operational amplifier (33) having a feedback resistor, the output of the third operational amplifier being connected to one input of said first operational amplifier through a second variable resistance ($R_3$), the one input of said first operational amplifier being adapted to receive the signal input to said low-pass filter with the output from said low-pass filter being taken from the output of said second operational amplifier;

said high-pass filter comprising a fourth operational amplifier (41) having a variable feedback resistor in parallel with a feedback capacitor, one input thereto receiving the signal input to said high-pass filter, the output of said fourth operational amplifier being connected to one input of a fifth operational amplifier (42) having a feedback resistor through a series resistance ($R_{10}$), the output of said fifth operational amplifier being connected to one input of a sixth operational amplifier (43) having a feedback capacitor through a third variable resistance ($R_{12}$), the output of said sixth operational amplifier being connected to said one input of said fourth operational amplifier through a fourth variable resistance ($R_9$).

5. An automatic graphic equalizer comprising:
pink noise generating means;
means for producing pink noise from said pink noise generating means on an audio signal line;
graphic equalizer means connected to said audio signal line for adjusting the frequency characteristics of received signals;
means for converting the output from said graphic equalizer means into a sound signal and for introducing said sound signal into a selected physical environment;
sound detecting means for detecting sound in said selected physical environment; and
control means for detecting the respective levels of the signals detected by said sound detecting means in a plurality of frequency bands and for controlling the frequency characteristics of said graphic equalizer on the basis of the respective detected levels;
said control means including a frequency-variable band-pass filter for detecting the respective signal levels in said plurality of frequency bands, the center frequency of the pass-band of said band-pass filter being changeable by controlling filter circuit parameters;
wherein said control means further includes a level detector for smoothing the output of said frequency-variable band-pass filter, an analog-to-digital converter receiving the output from said level detector and controller means responsive to the digital output from said converter for controlling the frequency characteristics of said graphic equalizer in response to the levels detected by the frequency-variable band-pass filter;
said equalizer further including a band-pass filter arranged to receive the same signals received by said frequency-variable band-pass filter and switch means for selectively connecting either the band-pass filter or frequency-variable band-pass filter to said level detector.

* * * * *